May 3, 1966 L. J. YUSKA ETAL 3,248,779

METHOD OF MAKING AN ELECTRONIC MODULE

Filed Nov. 15, 1963

INVENTORS.
LEONARD J. YUSKA
DAVID P. ZIMMERMAN
BY H. H. Losche
Paul S. Collignon ATT'YS.

United States Patent Office 3,248,779
Patented May 3, 1966

3,248,779

METHOD OF MAKING AN ELECTRONIC MODULE

Leonard J. Yuska, Greenwood, and David P. Zimmerman, Noblesville, Ind., assignors to the United States of America as represented by the Secretary of the Navy Filed Nov. 15, 1963, Ser. No. 324,156
4 Claims. (Cl. 29—155.5)

The invention described herein may be manufactured and used by or for the Government of the United States of America for governmental purposes without the payment of any royalties thereon or therefor.

The present invention relates to electronic modules and more particularly to a method of making electronic modules that are comprised of integrated circuitry components which are formed by the deposition of thin films onto insulated substrates, such as glass, fused silica, or ceramic substrates.

One concept of microelectronics which offers great reduction in size and weight of electronic units is that of integrated circuitry which is formed on insulated bases. Integrated circuitry includes a number of active and passive components which are fabricated by one or more of a combination of several thin films which are deposited onto a substrate.

While conductors can be readily deposited onto substrates, the thin films cannot be subjected to any wear, and consequently, some kind of terminals must be provided on the substrates. This necessitates the fastening of the substrate to the terminals, which often are in some form of a connector.

One method of making an electronic module is shown in U.S. Patent 3,082,327, which issued March 19, 1963, to Rex Rice. In this patent, a large base printed circuit board is utilized and a plurality of subassembly printed circuit boards are attached thereto so that the bottom plane surface of each subassembly printed circuit board is in contact with the top surface of the base printed circuit board. Confined areas of a hardened sprayed metal extending from the circuitry on the subassembly printed circuit boards to the circuitry on the base printed circuit board provide the desired interconnections.

In the present invention, a flat, relatively thin printed circuitry board is provided with a plurality of conductor patterns on one side thereof and an adhesive is applied to the opposite side. The printed circuitry board is folded in half with the conductors being on the outside of each folded half. A portion of the conductors are loosened from the printed circuitry board and a substrate is attached to each side of the printed circuitry board. The loosened conductor ends are then electrically connected to the desired components on the substrates.

It is therefore a general object of the present invention to provide an improved method of making an electronic module.

Another object of the present invention is to provide an improved method of attaching a plug-in connector to an integrated circuitry assembly.

Other objects and advantages of the present invention will be readily appreciated as the same becomes better understood by reference to the following detailed description when considered in connection with the accompanying drawing wherein.

Figures 1, 2, 3, 4, 5, 6, 7:
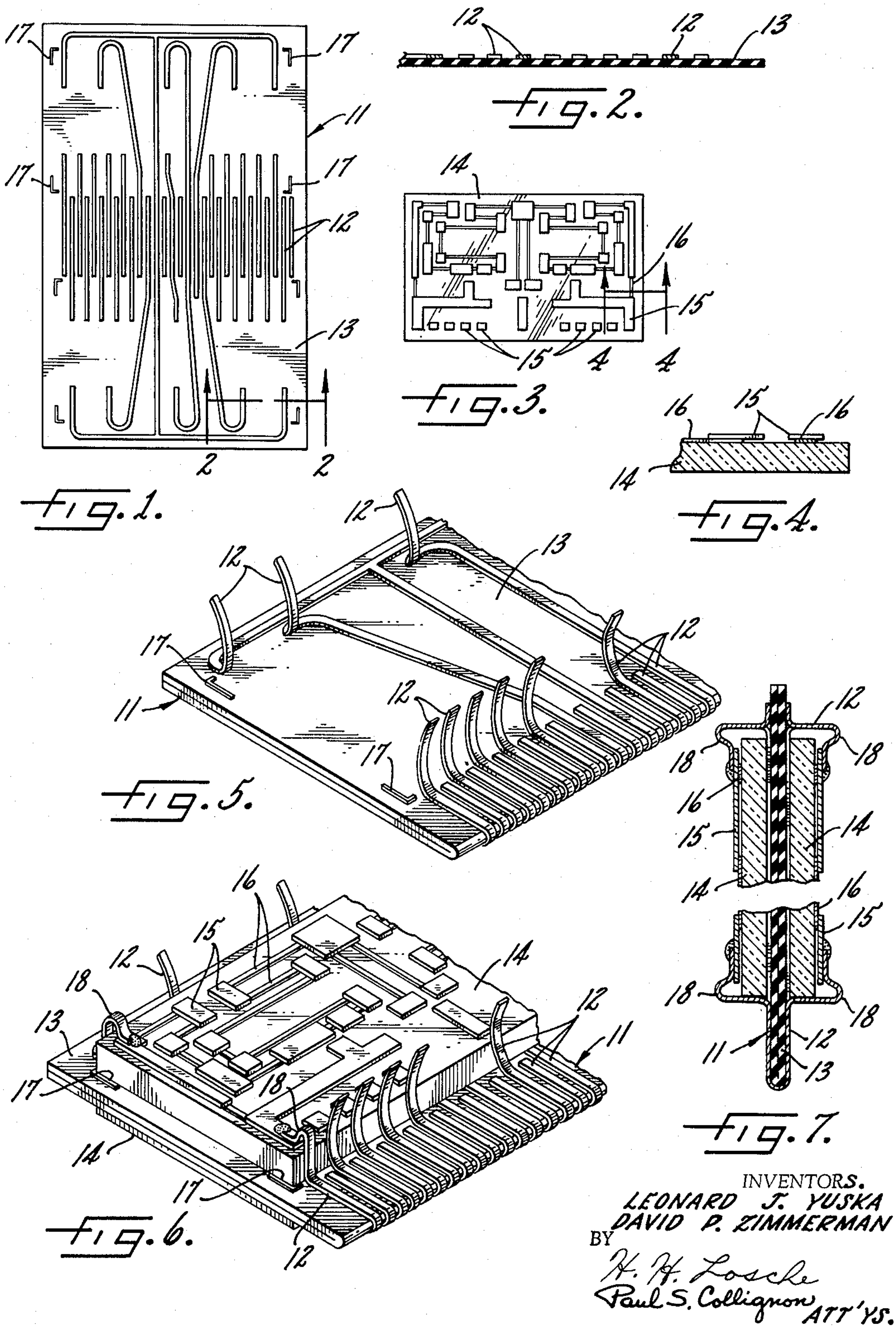
FIGURE 1 is a top plan view of a printed circuitry board.
FIGURE 2 is a sectional view taken on line 2—2 of FIGURE 1.
FIGURE 3 is a top plan view of an integrated circuitry assembly.
FIGURE 4 is a sectional view taken on line 4—4 of FIGURE 3.
FIGURE 5 is a perspective view of a printed circuitry board that has been folded in half.
FIGURE 6 is a perspective view of a folded printed circuitry board having a pair of integrated circuitry assemblies attached thereto.
FIGURE 7 is a side view of a completed electronic module.

Referring to FIGURES 1 and 2 of the drawing, there is shown a printed circuitry board 11 having a plurality of conductors 12 on a flexible insulating board 13, which by way of example might be of a glass epoxy material. Various methods for producing printed wiring circuits are well-known in the art, for example, U.S. Patent 2,861,029, issued Nov. 18, 1958, to L. A. Bain, Jr. et al. which describes a method of making printed wiring circuits by an etched-foil method.

Referring now to FIGURES 3 and 4 of the drawing, there is shown a substrate 14 having a plurality of conductors 15 and a plurality of resistors 16 thereon. The choice of conductor material is governed by a number of factors including adhesion to substrate and to adjacent layers, and compatibility with materials of adjacent layers. Metals such as chromium, titanium, and aluminum adhere tenaciously to other metals, glass and ceramics, but are extremely difficult to holder because they form an oxide coating. On the other hand, metals such as copper, gold, and silver are easily soldered, but do not adhere well to glass or ceramic. Consequently, it is often desirable to use two or more metals to obtain a satisfactory conductor, such for example, as by first depositing a layer of chromium, and then depositing a layer of gold on the chromium before the chromium has had time to form an oxide coating thereon.

A suitable thin film resistor material should be chemically inert to atmospheric gases, electrically and thermally stable, and relatively free of electrical and thermal noise. In addition, the film should be capable of adhering tenaciously to the substrate and have a coefficient of thermal expansion approximating that of the substrate material. One widely used thin film material is tin oxide which is deposited on a substrate by the hydrolysis of tin chloride. Other widely used materials are tantalum and nickel-chromium.

An adhesive is applied to the side of printed circuitry board 11 that does not have any conductors thereon and board 11 is then folded in half whereupon the two halves become cemented together. The ends of conductors 12 that are to be fastened to substrate 14 are then loosened, as shown in FIGURE 5 of the drawing.

Next a substrate 14 is attached, as by cementing, to each side of the folded printed circuitry board 11. In order to facilitate location of the susbtrates 14 on board 11, location markers 17 are provided on board 11. After the substrates 14 are secured in position, the loosened ends of conductors 12 are secured, as by soldering, to the appropriate areas on substrates 14. As best shown in FIGURE 7 of the drawing, a strain relief loop 18 is formed before each conductor is attached to substrate 14. This loop 18 permits a small amount of relative movement between substrates 14 and printed circuitry board 11, and thus helps prevent the conductors 15 from being peeled off of substrate 14.

It can thus be seen that the present invention provides an improved method of making an electronic module that can be used as a plug-in unit.

Obviously many modifications and variations of the present invention are possible in the light of the above teachings. It is therefore to be understood, that within the scope of the appended claims, the invention may be practiced otherwise than as specifically described.

What is claimed is:

1. A method of making an electronic module comprising:

first folding in half a flexible printed circuitry board having a plurality of conductors on one side thereof, said board being folded whereby said conductors are on the outer side of each folded half, then loosening from each half of said board an end portion of said conductors, then securing the substrate of an integrated circuitry component having conductors thereon to each side of said folded board, and then juxtaposing and making electrical connections between the conductors of said integrated circuitry components and the loosened portions of said conductors on said printed circuitry board.

2. A method of making an electronic module as set forth in claim 1 wherein a strain-relief loop is formed in the loosened portion of each said conductor when each said conductor is connected to a conductor on said integrated circuitry component.

3. A method of making an electronic module comprising:

first depositing a plurality of electrical components including a plurality of conductors on a nonconducting substrate, then folding in half a flexible printed circuitry board having an adhesive on one side and a plurality of conductors on the other side, said board being folded whereby said conductors are on the outer side of each folded half;

then loosening from said printed circuitry board a portion of said conductors, securing the substrate to one side of the board, and then soldering the loosened portion of said conductors on said printed circuitry board to the component conductors on said substrate.

4. A method of making an electronic module as set forth in claim 3 wherein a strain-relief loop is formed in the loosened portion of each said conductor when said conductor is soldered one each to each said component conductor on said substrate.

No references cited.

WHITMORE A. WILTZ, *Primary Examiner.*

W. I. BROOKS, *Assistant Examiner.*